(12) United States Patent
Odaka et al.

(10) Patent No.: US 10,163,987 B2
(45) Date of Patent: Dec. 25, 2018

(54) DISPLAY DEVICE AND MANUFACTURING METHOD OF A DISPLAY DEVICE

(71) Applicant: Japan Display Inc., Minato-ku (JP)

(72) Inventors: Kazuhiro Odaka, Minato-ku (JP); Norihisa Maeda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/729,790

(22) Filed: Oct. 11, 2017

(65) Prior Publication Data

US 2018/0108714 A1    Apr. 19, 2018

(30) Foreign Application Priority Data

Oct. 17, 2016  (JP) ................................. 2016-203751

(51) Int. Cl.
*H01L 27/32* (2006.01)
*H01L 51/52* (2006.01)
*H01L 51/00* (2006.01)
*G06F 1/16* (2006.01)

(52) U.S. Cl.
CPC ........ *H01L 27/3223* (2013.01); *G06F 1/1601* (2013.01); *H01L 27/3276* (2013.01); *H01L 51/0096* (2013.01); *H01L 51/524* (2013.01); *H01L 51/5237* (2013.01); *H01L 51/0097* (2013.01); *H01L 2227/323* (2013.01)

(58) Field of Classification Search
CPC ............. H01L 27/3223; H01L 27/3276; H01L 51/0096; H01L 51/5237; H01L 51/524; H01L 51/0097; H01L 2227/323; G06F 1/1601
USPC ............................................. 257/89; 313/504
See application file for complete search history.

(56) References Cited

U.S. PATENT DOCUMENTS

2014/0091704 A1*  4/2014  Furuie ................ H01L 51/5284
                                                 313/504

FOREIGN PATENT DOCUMENTS

JP         2014-72030         4/2014

* cited by examiner

*Primary Examiner* — Cuong Q Nguyen
*Assistant Examiner* — Tong-Ho Kim
(74) *Attorney, Agent, or Firm* — Oblon, McClelland, Maier & Neustadt, L.L.P.

(57) ABSTRACT

A manufacturing method of a display device according to an embodiment of the present invention includes: the display device including a protection plate having a light transmitting part facing an input or output device, and a display substrate having a display area, a light emitting film forming the step of forming an island-like light emitting film containing a light emitting material, in an area other than the display area in the display substrate; an alignment step of aligning the protection plate and the display substrate with each other; and an attaching step of attaching the protection plate to the display substrate.

9 Claims, 8 Drawing Sheets

DISPLAY DEVICE AND MANUFACTURING METHOD OF A DISPLAY DEVICE

CROSS-REFERENCE TO RELATED APPLICATION

The present application claims priority from Japanese application JP2016-203751 filed on Oct. 17, 2016, the content of which is hereby incorporated by reference into this application.

BACKGROUND OF THE INVENTION

1. Field of the Invention

One or more embodiments of the present invention relate to a display device and a manufacturing method of a display device, and particularly to the attaching of a protection plate to a display substrate.

2. Description of the Related Art

Conventionally, in the process of manufacturing a display device, a light-transmitting protection plate such as a cover glass is attached to a display substrate. In this process the protection plate is aligned with the display substrate by a technique called external alignment (see, for example, JP2014-72030A).

That is, in external alignment, the outer lateral surfaces of the display substrate and the protection plate are abutted against a butting member, and the positions of the display substrate and the protection plate are thus grasped.

SUMMARY OF THE INVENTION

However, with the conventional method, during attaching, even if the protection plate is relatively shifted from the display substrate, it is difficult to recognize and correct the shift.

Thus, it is conceivable that the display area of the display substrate is lit and that the protection plate is attached to a predetermined position on the display substrate, based on the position of the lit display area. However, lighting the display area of the display substrate before shipping should be avoided as much as possible.

In view of the foregoing problem, an objective of the invention is to provide a manufacturing method of a display device that enables accurate attaching of a protection plate to a display substrate without lighting its display area, and to provide a display device suitable for the method.

(1) A manufacturing method of a display device according to an embodiment of the present invention includes: the display device including a protection plate having a light transmitting part facing an input or output device, and a display substrate having a display area, a light emitting film forming the step of forming an island-like light emitting film containing a light emitting material, in an area other than the display area in the display substrate; an alignment step of aligning the protection plate and the display substrate with each other; and an attaching step of attaching the protection plate to the display substrate.

(2) In the manufacturing method of the display device as described in (1) above, the display substrate includes a flexible substrate, and the method further comprises a folding step of folding back the part where the light emitting film is formed in the display substrate, to the rear side of the display area, after the attaching step.

(3) In the manufacturing method of the display device as described in (2) above, after the folding step, the input or output device is arranged at a position facing the light transmitting part.

(4) In the manufacturing method of the display device as described in (1) above, in the alignment step, the light emitting film is made to emit light, the light emitting state of the light emitting film is confirmed through the light transmitting part, and the protection plate and the display substrate are aligned with each other.

(5) In the manufacturing method of the display device as described in (4) above, in the alignment step, the light emitting film is made to emit light by turning on electricity.

(6) In the manufacturing method of the display device as described in (4) above, in the alignment step, the light emitting film is made to emit light by being irradiated with external light.

(7) In the manufacturing method of the display device as described in (4) above, in the light emitting film forming step, the light emitting film is formed by the same process as the organic light emitting film provided in a pixel situated in the display area, and the manufacturing method further comprises a step of determining the quality of the organic light emitting film for pixel, based on light emission of the light emitting film.

(8) In the manufacturing method of the display device as described in (7) above, the light emitting film includes light emitting film in a plurality of colors, the pixel situated in the display area is in a plural number, and the display area is in a plurality of colors, in the light emitting film forming step, by the same process as the organic light emitting film provided in the pixels in the plurality of colors, the light emitting film in the plurality of colors corresponding thereto are formed, and based on light emission of the light emitting film in the plurality of colors, the quality of the organic light emitting film in the corresponding color is determined.

(9) In the manufacturing method of the display device as described in (1) above, the periphery of the light transmitting part of the protection plate is opaque.

(10) A display device according to one or more embodiments of the present invention includes: a display panel which has a display area and a peripheral area outside the display area and in which an island-like light emitting film containing a light emitting material is arranged in the peripheral area; and a protection plate having a light transmitting part and attached to the display panel. At least one part where the light emitting film is arranged, of the peripheral area, is folded back to the side opposite the side where the protection plate is situated, and the light transmitting part and the light emitting film are superimposed on each other when the part where the light emitting film is arranged is not folded back and the display panel is in a non-curved state.

(11) In the display device as described in (10) above, an input or output device faces the light transmitting part.

(12) In the display device as described in (11) above, the input or output device is that of a speaker, a microphone, a camera, and a button to operate the display device.

(13) In the display device as described in (10) above, the light emitting film can emit light by turning on electricity.

(14) In the display device as described in (10) above, the light emitting film can emit light by being irradiated with external light.

(15) In the display device as described in (10) above, the light emitting film is in a plural number and in a plurality of colors.

(16) In the display device as described in (10) above, the periphery of the light transmitting part of the protection plate is opaque.

(17) In the display device as described in (10) above, the peripheral area includes a first area and a second area, the display area is situated between the first and second areas, and the light emitting film includes a first light emitting film situated in the first area and a second light emitting film situated in the second area.

(18) In the display device as described in (13) above, the peripheral area includes a first and second area, the display area is situated between the first and second areas, the light emitting film includes a first light emitting film situated in the first area and a second light emitting film situated in the second area, the first light emitting film and the second light emitting film are connected to each other via wiring, and the display panel is provided with a terminal connected to the wiring.

According to the inventions described in (1) and (10), alignment in which at least that of a display substrate or a protection plate is moved is carried out, based on a light emitting film in a light emitting state, and the protection plate is attached to a predetermined position on the display substrate. Thus, the protection plate can be accurately attached to the display substrate without lighting its display area.

According to the inventions described in (2), (3), (10) and (11), because of the flexibility of the display substrate, the part where the light emitting film is formed in the display substrate can be folded back to the rear side of the display area after the attaching process, and an input or output device can be arranged in a light transmitting part of the protection plate.

According to the inventions described in (4), (5) and (13), the light emitting film is turned into the light emitting state. Thus, the positions of the protection plate and the display substrate can be securely grasped.

According to the inventions described in (6) and (14), the light emitting film is configured to emit light by having light cast thereon from outside. Thus, the light emitting film can be turned into the light emitting state without having to supply electricity.

According to the invention described in (7), in the process of forming the light emitting film, the light emitting film is formed by the same process as an organic light emitting film provided in the display area. Thus, the quality of the organic light emitting film can be determined, based on the light emission of the light emitting film, simultaneously with the attaching process.

According to the inventions described in (8) and (15), in the process of forming the organic film, a plurality of light emitting films in a plurality of colors is formed by the same process as each of organic light emitting films in a plurality of colors provided in the display area. Thus, based on the light emission of each light emitting film, the quality of the organic light emitting film in the corresponding color can be determined, simultaneously with the attaching process.

DETAILED DESCRIPTION OF THE INVENTION

Below, first and second embodiments of the invention will be described, referring to the drawings. The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Figure 1:
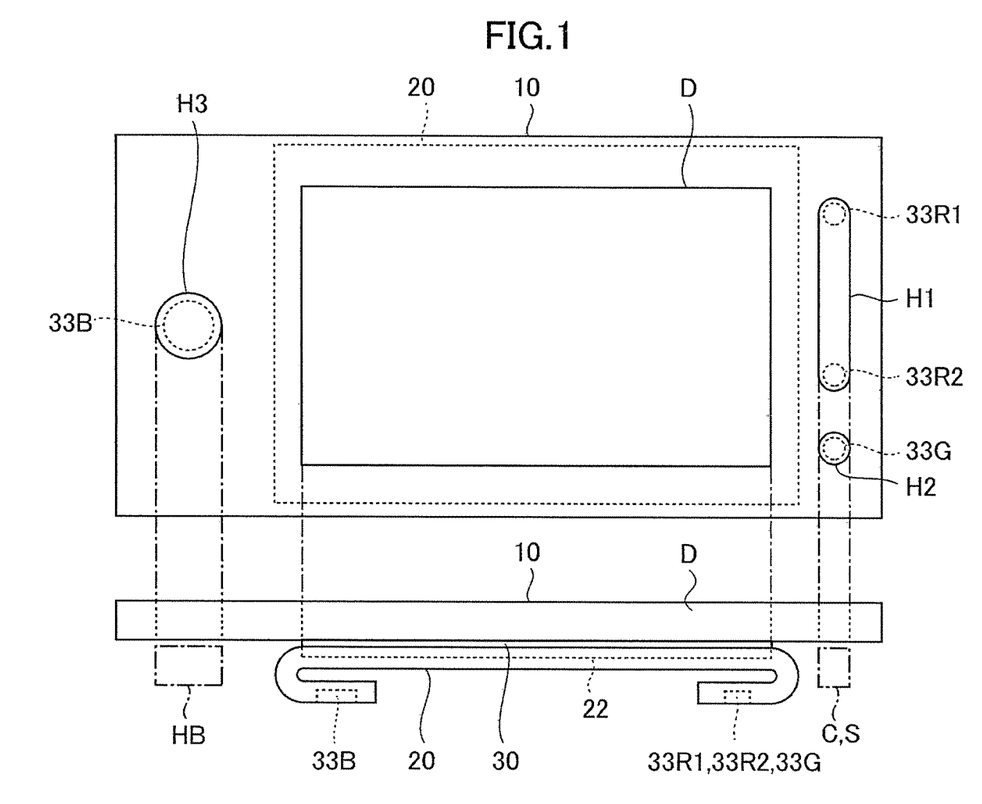
FIG. 1 is a plan view and a side view of a display device according to an embodiment of the invention.
Figure 2:
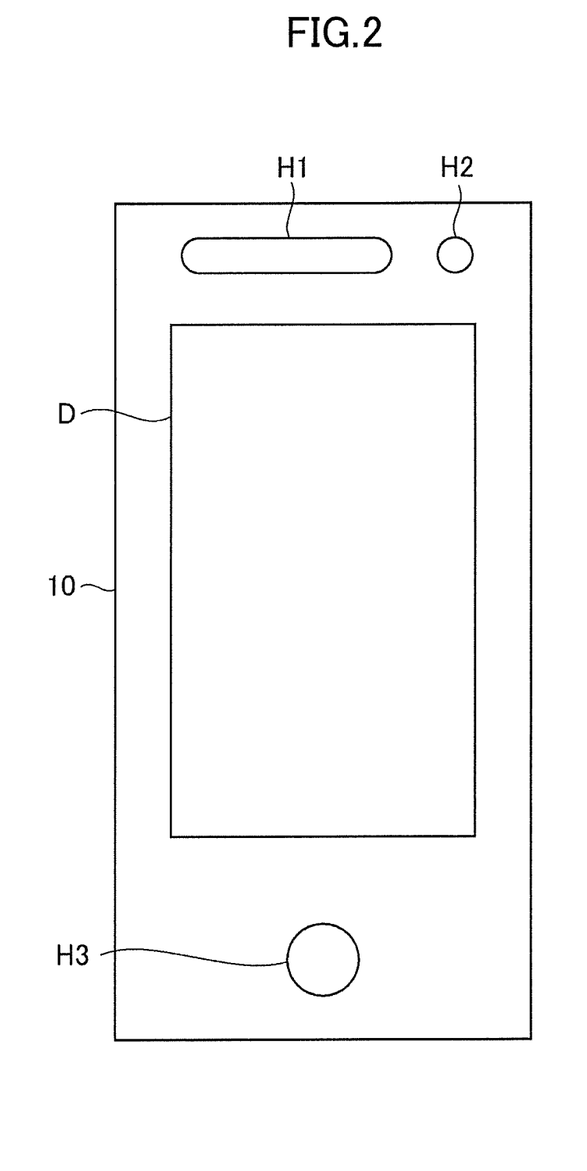
FIG. 2 is a plan view of a protection plate forming the display device shown in FIG. 1.
Figure 3:
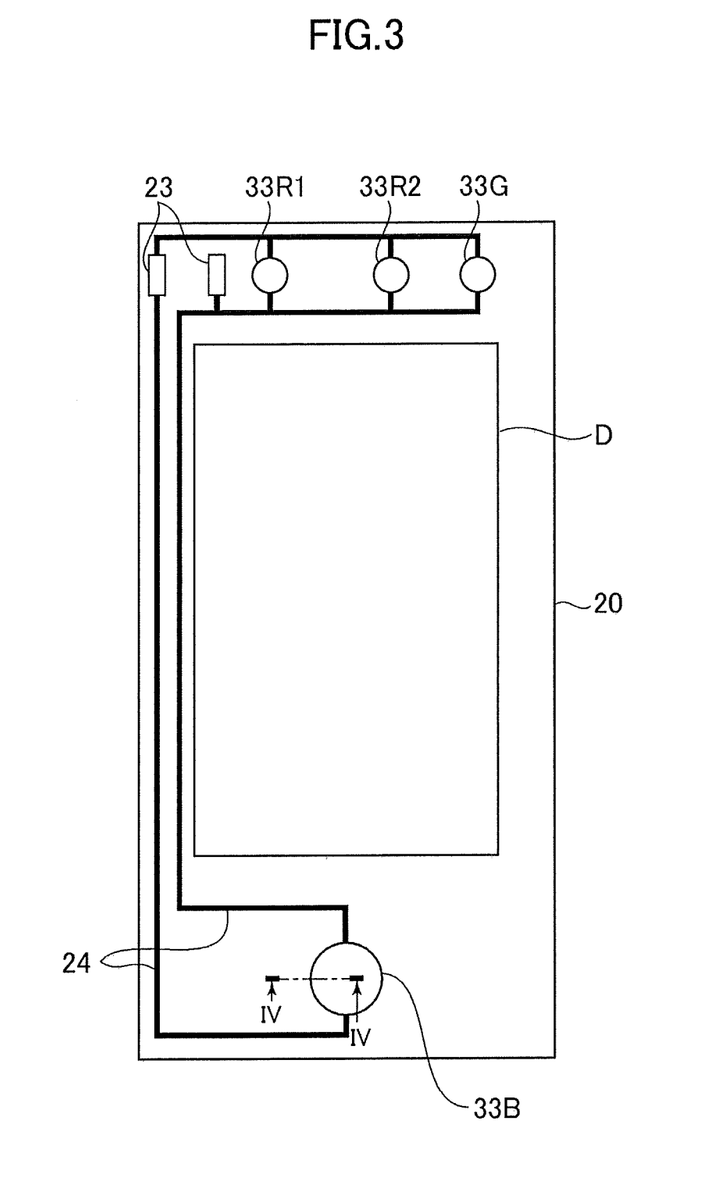
FIG. 3 is a plan view of the display substrate according to the first embodiment forming the display device shown in FIG. 1.

First, referring to FIGS. 1 to 5, a manufacturing method of a display device 100 according to a first embodiment will be described. FIG. 1 shows the display device 100 according to one embodiment of the invention. The top part of FIG. 1 is the plan view. The bottom part is the side view. FIG. 2 is a plan view showing the protection plate 10 of the display device 100 according to the embodiment of the invention. FIG. 3 is a plan view of the display substrate 20 (also referred to as the display panel) of the display device 100 according to the first embodiment.

The display device 100 is an image display device such as a smartphone, for example. As shown in FIG. 1, the display device 100 has the display substrate 20, the protection plate 10 provided over the display substrate 20, and an adhesive layer 30 which attaches the protection plate 10 to the display substrate 20. The adhesive layer 30 may be, for example, a double-sided adhesive tape, a layer of single type resin made up of an epoxy resin or similar, or a multilayer structure made up of a plurality of resins.

The protection plate 10 is longitudinally rectangular and made up of a light-transmitting material, for example, glass or plastics. The protection plate 10 is a member situated on the image display surface layer of the display device 100 and forms part of the appearance. The protection plate 10 is provided over the display substrate 20 via an adhesive layer 30.

The protection plate 10 has openings where an image display area D at a center part as viewed in a plan view and an input or output device are arranged, that is, light-transmitting parts that face the display area D and the input or output device. For example, in a portable image display device such as a smartphone, the speaker S is arranged in opening H1, camera C is arranged in opening H2, and home button HB is arranged in opening H3, as shown in FIG. 1. In opening H1, a microphone may be arranged other than speaker S. Also, a light shield film is formed in the areas other than display area D and the openings, thus making these areas opaque.

The display substrate 20 has a TFT (thin film transistor) including a thin film transistor or similar made up of a plurality of layers stacked on a polyimide film 21 as an insulating substrate that is flexible and can be folded back.

The display substrate 20 is longitudinally rectangular and has the image display area D at the center part as viewed in a plan view. The display area D is an area where an image is displayed on an organic EL (electroluminescent) display or similar. An organic light emitting film for pixel 22 is provided in this area.

In the areas other than the display area D, that is, in the peripheral areas, an alignment mark, that is, an island-like light emitting film, having an organic light emitting film for alignment 33 is provided to be situated in the openings in the protection plate 10 as viewed in the plan view, as shown in FIG. 1. This organic light emitting film for alignment 33 is turned into a light emitting state in an attaching process, described later. Thus, the position of the light of the organic light emitting film for alignment 33 is confirmed via the openings, and a misalignment between the protection plate 10 and the display substrate 20 is corrected before and during the attaching process.

The organic light emitting film for alignment 33 is connected to a light emission power supply wiring for alignment mark 24, as shown in FIG. 3. With this configuration, electricity is supplied to an electrode of the organic light emitting film for alignment 33 from a light emission power supply terminal for alignment mark 23 via the light emission power supply wiring for alignment mark 24, independently of the light emission power supply wiring of the organic light emitting film for pixel 22.

With respect to the display substrate 20 of the display device 100 according to the first embodiment, as described above, a manufacturing method of the display device including an attaching process with a display substrate having the organic light emitting film for alignment 33 which emits light when supplied with external electricity is described. However, the light emitting method of the organic light emitting film for alignment is not limited to this. A display substrate or similar having an organic light emitting film for alignment which turns into a light emitting state when irradiated with excitation light such as laser-like ultraviolet (UV) light without having to use a power supply device may be used, as in a display substrate 20 of a display device 100 according to a second embodiment, described later.

The organic light emitting film for alignment 33 is prepared by the same process as the organic light emitting film for pixel 22 and has the same multilayer structure as the organic light emitting film for pixel 22. A red (R) organic light emitting film of the organic light emitting film for alignment 33 corresponds to a red (R) organic light emitting film of the organic light emitting film for pixel 22. A green (G) organic light emitting film of the organic light emitting film for alignment 33 corresponds to a green (G) organic light emitting film of the organic light emitting film for pixel 22. A blue (B) organic light emitting film of the organic light emitting film for alignment 33 corresponds to a blue (B) organic light emitting film of the organic light emitting film for pixel 22. Thus, based on the light emission of the organic light emitting film for alignment 33, the quality of the organic light emitting film for pixel 22 of the corresponding color can be determined.

In the display substrate 20, organic light emitting film for alignment 33R1, 33R2 having a red organic light emitting film is provided at positions corresponding to both ends of opening H1, as shown in FIGS. 1 and 3. An organic light emitting film for alignment 33G having a green organic light emitting film is provided at a position corresponding to the opening H2. An organic light emitting film for alignment 33B having a blue organic light emitting film is provided at a position corresponding to the opening H3. Also, the shape of the organic light emitting film for alignment 33 as viewed in the plan view is not limited to the circle as shown in FIGS. 1 and 3. The shape of the organic light emitting film for alignment 33 is not limited, provided that the organic light emitting film for alignment 33 is situated inside the opening.

Figure 4:
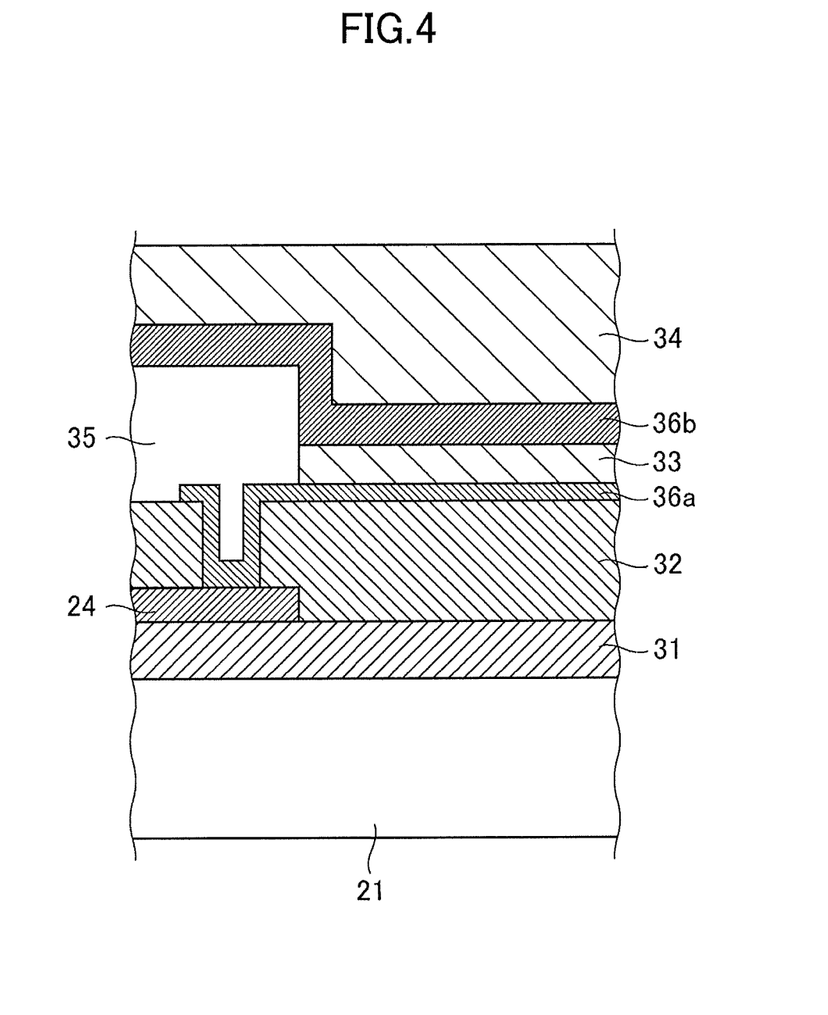
FIG. 4 is a cross-sectional view taken along IV-IV of the display substrate shown in FIG. 3.

Next, the configuration of the alignment mark having the organic light emitting film for alignment 33 will be described in detail. FIG. 4 is a cross-sectional view taken along IV-IV of the display substrate 20 shown in FIG. 3. As shown in FIG. 4, the alignment mark has a multilayer structure including, in order from the bottom, a barrier film 31, a flattening film 32, the light emission power supply wiring for alignment mark 24, the organic light emitting film for alignment 33, and a sealing film 34 sealing the organic light emitting film for alignment 33, on the polyimide film 21.

The barrier film 31 is made up of a protection film which shuts off moisture in order to protect an organic material and an electrode that form the organic light emitting film, for example, Si oxide or nitride, or metal oxide of Al, Zn or similar.

The flattening film 32 is provided in order to flatten and insulate the surface of the TFT and is made up of an organic resin material such as acrylic-based resin or polyimide-based resin, for example.

The organic light emitting film for alignment 33 is a film including an anode electrode 36a as a lower electrode provided in the layer under the organic light emitting film for alignment 33, and a cathode electrode 36b as an upper electrode provided in the layer over the organic light emitting film for alignment 33. While the upper electrode is the cathode electrode and the lower electrode is the anode electrode in this embodiment, this is not limiting. The upper electrode may be the anode electrode and the lower electrode may be the cathode electrode. The anode electrode 36a and the light emission power supply wiring for alignment mark 24 are made up of a metal such as Ag or Al, for example. Meanwhile, the cathode electrode 36b is made of a light-transmitting and electrically conductive material such as ITO (indium tin oxide), for example.

The area covering the anode electrode 36a, of the organic light emitting film for alignment 33, is a light emitting area. The area where a bank layer 35 made of an insulating member is inserted between the cathode electrode 36b and the anode electrode 36a is a non-light emitting area. The organic EL film is formed of an electron transport layer, a light emitting layer, and a hole transport layer stacked in order from the negative electrode toward the positive electrode. When DC voltage is applied to the anode electrode 36a and the cathode electrode 36b, holes injected from the cathode electrode 36b move through the hole transport layer and electrons injected from the anode electrode move through the electron transport layer. Thus, the holes and the electrons reach the organic light emitting film for alignment 33 and are recombined. By such recombination of electrons and holes, the organic light emitting film for alignment 33 emits light with a predetermined wavelength. The multilayer structure of the alignment mark is not limited to the structure described here. The multilayer structure is not particularly limited, provided that at least the organic light emitting film for alignment 33 is included therein.

The sealing film 34 is made of a resin such as SiN or SiO, for example. The sealing film 34 may be a single-layer film or multilayer structure made of this material. On the sealing film 34 of the organic light emitting film for pixel 22, the adhesive layer 30 for attaching the protection plate 10 to the display substrate 20 is provided.

Figure 5:
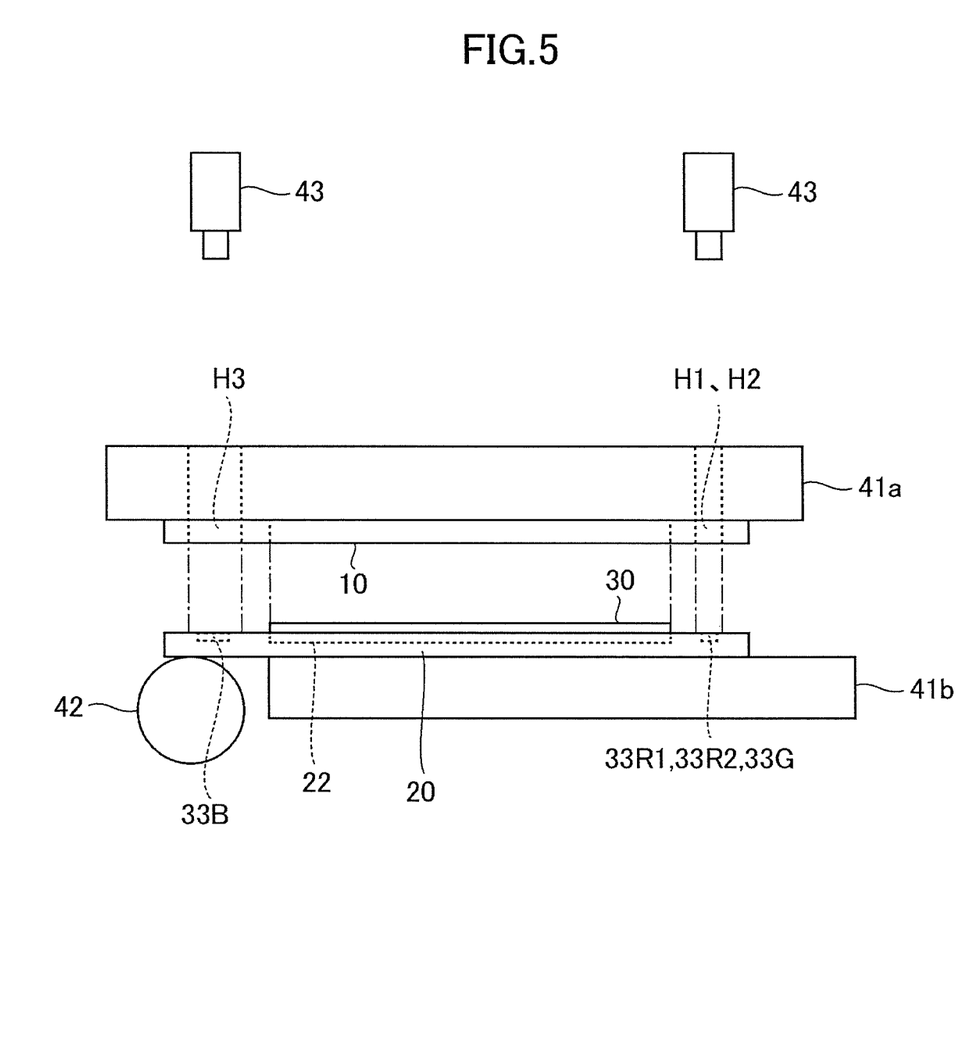
FIG. 5 is a side view showing the manufacturing method of the display device according to the first embodiment of the invention.

Next, the process of aligning the protection plate 10 with a predetermined position on the display substrate 20 and attaching the protection plate 10 to the display substrate 20, based on the position of the alignment mark in the light emitting state, will be described with reference to FIG. 5. FIG. 5 is a side view showing the manufacturing method of the display device 100 according to the first embodiment of the invention.

First, by external alignment as in the conventional technique, the outer lateral surfaces of the protection plate 10 and the display substrate 20 are abutted against a butting member. Thus, the positions of the protection plate 10 and the display substrate 20 are grasped and alignment is carried out with jigs 41a, 41b.

Next, electricity is supplied to the organic light emitting film for the alignment of 33R1, 33R2, 33G, 33B of the display substrate 20 from the light emission power supply terminal for alignment mark 23 via the light emission power supply wiring for alignment mark 24. Thus, organic light emitting film for alignment is turned into the light emitting state.

Subsequently, the peripheral image of each of openings H1, H2, H3 in the protection plate 10 is taken in by an alignment camera 43 provided above the protection plate 10, and position information of the light of the organic light emitting film for alignment 33R1, 33R2, 33G, 33B in the light emitting state is read by a device having an image analysis function. Thus, the positions of opening H1 in the protection plate 10 and the organic light emitting film for alignment 33R1, 33R2, the positions of opening H2 and the organic light emitting film for alignment 33G, and the positions of opening H3 and the organic light emitting film for alignment 33B can be visually recognized.

Subsequently, attaching process is carried out with a roller 42, as in the conventional technique. However, at the same time, in order to maintain the positions of openings H1, H2, H3 in the protection plate 10 and the organic light emitting film for alignment 33R1, 33R2, 33G, 33B at predetermined positions, an actuator modifies the position of the jig of at least one of the protection plate 10 and the display substrate 20. Thus, the offering up process, aligning process and attaching process can be carried out more mechanically accurately by the device having the image analysis function.

After the attaching, an upper area and a lower area, outside the display area D having the organic light emitting film for alignment 33R1, 33R2, 33G, 33B, are folded back to the rear side of the display area D of the display substrate 20. Thus, the display device 100 is completed as shown in FIG. 1. The shape of the folding to the rear side of the display area D of the display substrate 20 is not limited to the shape shown in FIG. 1. For example, the upper area and the lower area, outside the display area D having the organic light emitting films for alignment 33R1, 33R2, 33G, 33B, may be removed. Also, a slit or cutout may be formed in the polyimide film 21 so that the polyimide film 21 can be easily folded back.

Next, a manufacturing method of a display device 100 according to a second embodiment will be described, referring to FIGS. 1, 2, 6 to 8. In this embodiment, the display device 100 is manufactured by attaching a protection plate 10 to a display substrate 20 having an organic light emitting film for alignment which turns into a light emitting state when irradiated with excitation light such as laser-like ultraviolet (UV) light without having to use a power supply device, as described above. Therefore, the description of the display device 100 and the protection plate 10 is the same as in the first embodiment and therefore is omitted here.

Figure 6:
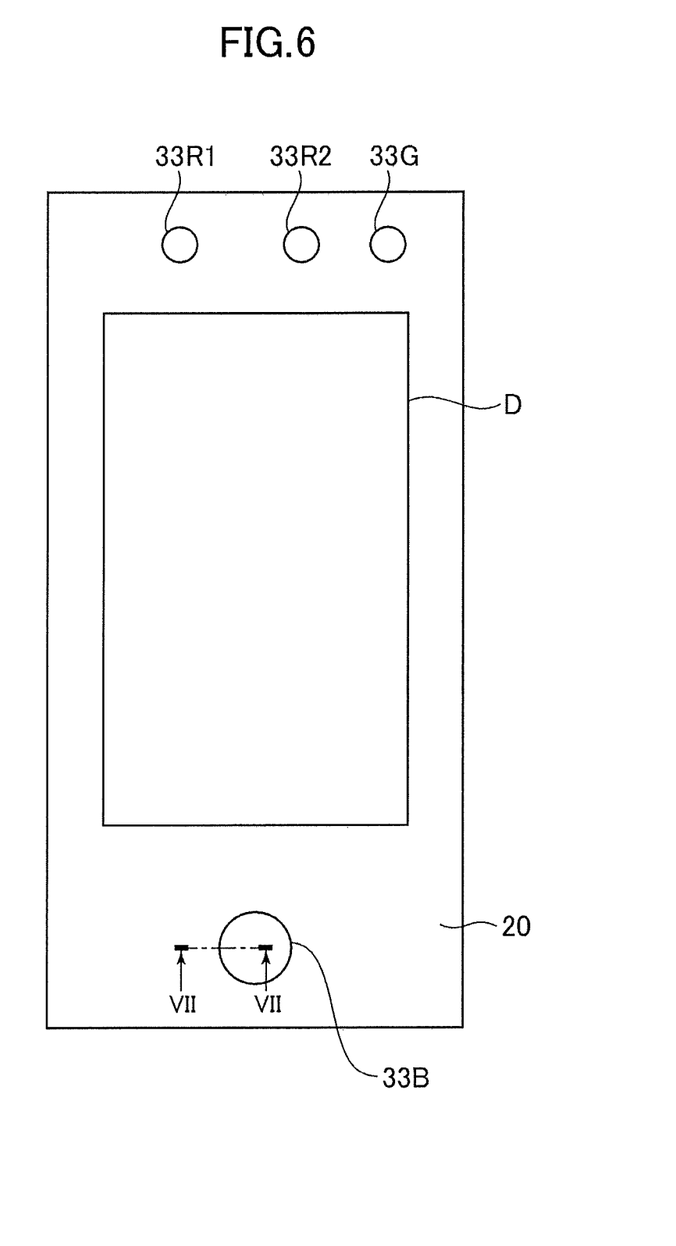
FIG. 6 is a plan view of the display substrate according to the second embodiment forming the display device shown in FIG. 1.

FIG. 6 is a plan view of the display substrate 20 of the display device 100 according to the second embodiment. The configuration of the display substrate 20 according to the second embodiment is the same as that of the display substrate 20 according to the first embodiment, except for the absence of the light emission power supply terminal for alignment mark 23 and the light emission power supply wiring for alignment mark 24 as the power supply devices and except for the multilayer structure of the organic light emitting film for alignment 33. Therefore, in this embodiment, the configuration of the display substrate 20 is not described further. The organic light emitting film for alignment 33 is prepared by the same process as the organic light emitting film for pixel 22 and has the same multilayer structure.

In the display substrate 20, organic light emitting film for alignment 33R1, 33R2 having a red organic light emitting film is provided at positions corresponding to opening H1, as shown in FIGS. 1 and 6. An organic light emitting film for alignment 33G having a green organic light emitting film is provided at a position corresponding to opening H2. An organic light emitting film for alignment 33B having a blue organic light emitting film is provided at a position corresponding to opening H3. Also, the shape of the organic light emitting film for alignment 33 as viewed in a plan view is not limited to the circle as shown in FIGS. 1 and 6. The shape of the organic light emitting film for alignment 33 is not limited, provided that the organic light emitting film for alignment 33 is situated inside opening.

Figure 7:
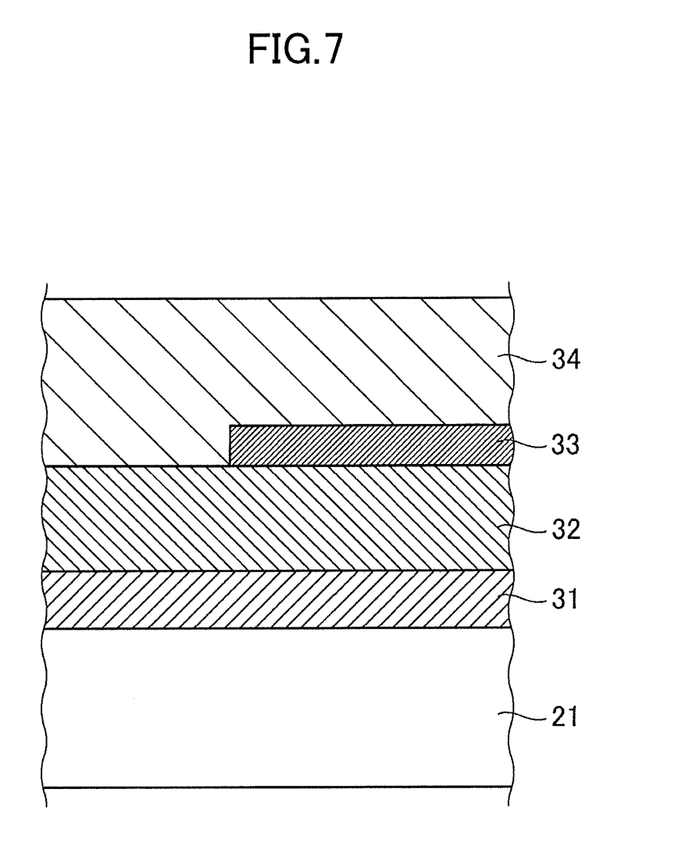
FIG. 7 is a cross-sectional view taken along VII-VII of the display substrate shown in FIG. 6.

The configuration of the alignment mark having the organic light emitting film for alignment 33 will be described in detail. FIG. 7 is a cross-sectional view taken along VII-VII of the display substrate 20 shown in FIG. 6. As shown in FIG. 7, the alignment mark has a multilayer structure including, in order from the bottom, a barrier film 31, a flattening film 32, the organic light emitting film for alignment 33, and a sealing film 34 sealing the organic light emitting film for alignment 33, on a polyimide film 21. In this alignment mark, the organic light emitting film for alignment turns into a light emitting state, based on PL (photoluminescence) light emission generated when excited electrons return to the ground state by being irradiated with laser-like ultraviolet (UV) light.

Figure 8:
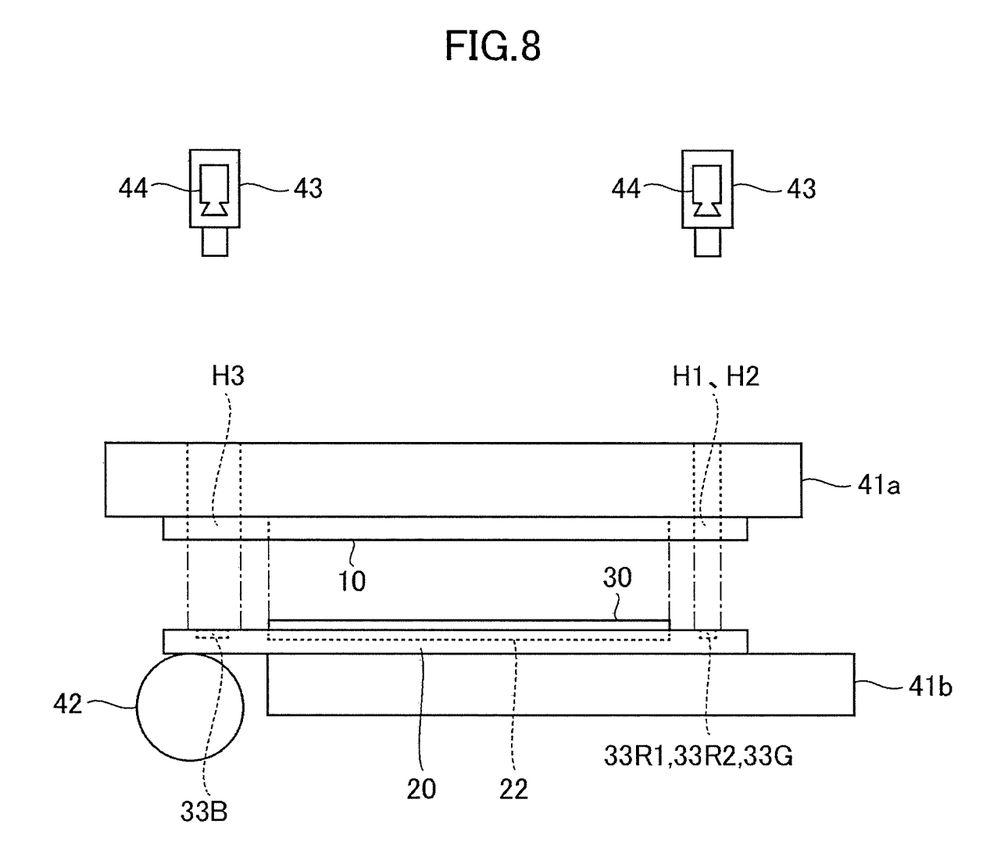
FIG. 8 is a side view showing the manufacturing method of the display device according to the second embodiment of the invention.

Next, the process of aligning the protection plate 10 with a predetermined position on the display substrate 20 and attaching the protection plate 10 to the display substrate 20, based on the position of the alignment mark in the light emitting state, will be described with reference to FIG. 8. FIG. 8 is a side view showing the manufacturing method of the display device 100 according to the second embodiment of the invention.

First, by external alignment as in the conventional technique, the outer lateral surfaces of the protection plate 10 and the display substrate 20 are abutted against a butting member. Thus, the positions of the protection plate 10 and the display substrate 20 are grasped and alignment is carried out with jigs 41a, 41b.

Next, a UV light 44 installed above the protection plate 10 is lit and casts ultraviolet light onto the organic light emitting film for alignment 33R1, 33R2, 33G, 33B situated below openings H1, H2, H3 in the protection plate 10. Thus, the organic light emitting film for alignment is turned into the light emitting state.

Subsequently, the peripheral image of each of openings H1, H2, H3 in the protection plate 10 is taken in by an alignment camera 43 provided above the protection plate 10, and position information of the light of the organic light emitting film for alignment 33R1, 33R2, 33G, 33B in the light emitting state is read by a device having an image analysis function. Thus, the positions of opening H1 in the protection plate 10 and the organic light emitting film for alignment 33R1, 33R2, the positions of opening H2 and the organic light emitting film for alignment 33G, and the positions of opening H3 and the organic light emitting film for alignment 33B can be visually recognized.

Subsequently, attaching process is carried out with a roller 42, as in the conventional technique. However, at the same time, in order to maintain the positions of the openings H1, H2, H3 in the protection plate 10 and the organic light emitting film for alignment 33R1, 33R2, 33G, 33B at predetermined positions, an actuator modifies the position of the jig of at least one of the protection plate 10 and the display substrate 20. Thus, the offering up process, aligning process and attaching process can be carried out more mechanically accurately by the device having the image analysis function.

After the attaching, an upper area and a lower area, outside a display area D having the organic light emitting films for alignment 33R1, 33R2, 33G, 33B, are folded back to the rear side of the display area D of the display substrate 20. Thus, the display device 100 is completed as shown in FIG. 1. The shape of the folding to the rear side of the display area D of the display substrate 20 is not limited to the shape shown in FIG. 1. For example, the upper area and the lower area, outside the display area D having the organic light emitting films for alignment 33R1, 33R2, 33G, 33B, may be removed. Also, a slit or cutout may be formed in the polyimide film 21 so that the polyimide film 21 can be easily folded back.

As described above, since the organic light emitting film for alignment is made to emit light, it is visually recognized that the alignment mark is situated inside opening, as viewed in a plan view. Therefore, compared with a display device that does not have this configuration, a manufacturing method of a display device that enables accurate attaching of a protection plate to a display substrate can be realized and a display device suitable for this method can be provided.

Those skilled in the art should be able to arrive at various kinds of variations and modifications within the spirit of the present invention, ant it is understood that such variations and modifications are within the scope of the present invention. For example, addition, deletion, or design change of components, or by addition, omission, or condition change of processes made by those skilled in the art as appropriate in each embodiment as described above are also encompassed within the scope of the present invention as long as they fall within the spirit of the present invention.

Also, it is understood that other advantageous effects brought about by the configurations described in the embodiments that are clear from the description in the specification or that can be properly thought of by a person skilled in the art are brought about by the invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
  a display panel which has a display area and a peripheral area outside the display area and in which an island-like light emitting film containing a light emitting material is arranged in the peripheral area; and
  a protection plate having a light transmitting part and attached to the display panel;
  wherein at least one part where the light emitting film is arranged, of the peripheral area, is folded back to a side opposite a side where the protection plate is situated, and
  the light transmitting part and the light emitting film are superimposed on each other when a part where the light emitting film is arranged is not folded back and the display panel is in a non-curved state.

2. The display device according to claim 1, wherein an input or output device faces the light transmitting part.

3. The display device according to claim 2, wherein the input or output device is that of a speaker, a microphone, a camera, and a button to operate the display device.

4. The display device according to claim 1, wherein the light emitting film can emit light by turning on electricity.

5. The display device according to claim 4, wherein the peripheral area includes a first and second area, the display area is situated between the first and second areas, the light emitting film includes a first light emitting film situated in the first area and a second light emitting film situated in the second area, the first light emitting film and the second light emitting film are connected to each other via wiring, and the display panel is provided with a terminal connected to the wiring.

6. The display device according to claim 1, wherein the light emitting film can emit light by being irradiated with external light.

7. The display device according to claim 1, wherein the light emitting film is in a plural number and in a plurality of colors.

8. The display device according to claim 1, wherein the periphery of the light transmitting part of the protection plate is opaque.

9. The display device according to claim 1, wherein the peripheral area includes a first area and a second area, the display area is situated between the first and second areas, and the light emitting film includes a first light emitting film situated in the first area and a second light emitting film situated in the second area.

* * * * *